United States Patent
Cavallotti et al.

[11] Patent Number: 5,759,379
[45] Date of Patent: Jun. 2, 1998

[54] SOLDER METHOD

[75] Inventors: Pietro Luigi Cavallotti; Adelio Monzani; Vittorio Sirtori, all of Milan, Italy; Giovanni Zangari, Pittsburgh, Pa.

[73] Assignee: International Business Machines Corporation, Armonk, N.Y.

[21] Appl. No.: 811,495

[22] Filed: Mar. 5, 1997

[30] Foreign Application Priority Data

Apr. 26, 1996 [GB] United Kingdom ............. 9608660

[51] Int. Cl.⁶ .................. C25D 5/10; C25D 5/50; B23K 1/20
[52] U.S. Cl. .................. 205/177; 205/225; 205/226; 228/208; 228/209
[58] Field of Search ............. 205/114, 176, 205/177, 184, 185, 186, 187, 191, 192, 193, 225, 226; 427/123, 124, 406, 98; 228/208, 209; 428/647, 658

[56] References Cited

U.S. PATENT DOCUMENTS 4,923,575  5/1990  Voss et al. ................ 204/44.2
5,393,489  2/1995  Gonya et al. .............. 420/561

FOREIGN PATENT DOCUMENTS

| 3153856 | 7/1991 | European Pat. Off. . |
| 5055404 | 3/1993 | European Pat. Off. . |
| 0700239 | 3/1996 | European Pat. Off. . |
| 700239 | 3/1996 | European Pat. Off. . |
| 2511189 | 1/1976 | Germany . |
| 56-413397 | 4/1981 | Japan . |
| 60-169589 | 9/1985 | Japan . |
| 825 317 | 12/1959 | United Kingdom . |

*Primary Examiner*—Kathryn L. Gorgos
*Assistant Examiner*—Edna Wong
*Attorney, Agent, or Firm*—Lawrence R. Fraley

[57] ABSTRACT

A soldering method for soldering electronic components onto a copper (Cu) substrate using a tin (Sn) solder alloy. The method comprises in pretreating the Cu substrate by depositing a thin layer of zinc (Zn) before the deposition of the Sn solder alloy. This method greatly enhances the mechanical and electrical properties of the solder alloy, allowing the use of lead (Pb) free alloys such as tin-bismuth (Sn—Bi).

13 Claims, No Drawings

SOLDER METHOD

TECHNICAL FIELD

The present invention relates to a method for soldering electronic components onto a copper substrate; it further relates to a circuit board and to a method for manufacturing said circuit board.

BACKGROUND OF THE INVENTION

The use of tin base solder alloys is common in electronic applications, particularly in the manufacturing of printed circuit boards (PCB), for assembly of components onto the boards, providing mechanical and electrical connection. These tin solder alloys are useful in joining integrated circuit chips to chip carriers and substrates, joining chip carriers to substrates, and joining circuitization lands and pads in multilayer printed circuit boards.

In the manufacturing of a microelectronic package, it is common practice to attach a component onto a printed circuit board or the like, for example by surface mounting utilizing a solder connection. For this purpose, the board features a circuit trace including a pad that constitutes a first surface for the connection; similarly, the component includes a second surface, for example a contact.

The interconnection method comprises the steps of applying a solder alloy on the Cu substrate, typically onto the pad included in the printed circuit board.

The electronic components to be joined with the board are then brought into contact with the solder layer. The solder alloy is heated to cause the solder alloy to melt and reflow; heating may be by vapour phase reflow, infrared reflow, laser reflow, or the like. Upon cooling, the solder alloy resolidifies and bonds to the surfaces to complete the connection. The solder connection not only physically attaches the component to the board, but also electrically connects the trace on the board and the contact of the component to conduct electrical current to and from the component for processing.

Tin-lead (Sn—Pb) alloys have been used for most electronic soldering operations. These alloys have been selected because of their mechanical strength, low relative cost, electrical conductivity and excellent wetting characteristics; wettability is an indication of how completely and quickly the molten solder can cover a solid surface. In addition, Sn—Pb alloys provide a low melting temperature, which is important in electronic applications because many components and printed circuit boards use materials that are easily damaged by exposure to high temperature during manufacture or assembly.

However, lead has been recognized as a health hazard, being toxic for workers and for the environment; recently governments have begun to urge the electronic industry to find alternatives to lead in order to reduce electronic industry worker lead exposure and reduce the amount of lead waste going back into the environment.

Lead presence in the soldering alloys is particularly critical in the case of application for manufacturing the most recent generation of C-MOS; in fact the details are so thin in this kind of board, that the emission of α particles from the emitting radioisotope present in the lead can provoke serious problems for the device.

Tin—Bismuth (Sn-Bi) solder alloys were investigated as alternative to Sn-Pb solder alloys. Electrodeposition of such Sn-Bi alloys from different electrolytes and in particular from alkyl sulphonate baths is known in the art, as described in Surf. & Coat. Tech—Vol. 27, 151–166 (1986)—Y. N. Sadana, R. N. Gedye, S. Ali. Electrodeposition of Sn-Bi alloys onto a PCB with an alkyl sulphonate electrolyte is also described in U.S. Pat. No. 5,039,576.

A different lead-free solder alloy for microelectronic applications is described in EP-A 94108684.5. Such document discloses solder alloys containing more than 90% weight percent tin (Sn), and an effective amount of silver (Ag) and bismuth (Bi), optionally with Antimony (Sb) or with Sb and copper (Cu). Different methods for obtaining the described alloys, including electrodeposition, are mentioned.

Lead-free solder alloys known in the art present however some drawbacks. They exhibit poor soldering and metallurgical properties, that is small peel strength and low creep resistance. Particularly, they have shown poor mechanical properties at temperatures of the type typically encountered by microelectronic packages during use.

It is an object of the present invention to provide a technique which alleviates the above drawbacks.

SUMMARY OF THE INVENTION

According to the present invention we provide a method for soldering electronic components onto a copper (Cu) substrate using a tin (Sn) solder alloy comprising the steps of:

depositing on the Cu substrate a zinc (Zn) layer; and
depositing the Sn solder alloy over the Zn layer.

In a preferred embodiment the solder alloy is lead (Pb) free, for example a tin-bismuth (Sn—Bi) alloy.

It is so realized that a pretreatment of the copper substrate causes the properties of tin based solder alloys to be substantially improved.

Zn is known to be usually harmful for a soldering process if present in a Sn alloy even in very little percentage (0.3% is enough). The result is that the wettability of the alloy is decreased, because Zn is highly reactive with oxygen and during reflow produces Zn oxide which compromises the connection between the pins of the electronic component and the solder alloy and prevents solder coalescence.

However if a thin Zn layer is deposited onto the Cu substrate before depositing the solder alloy, during the reflow it does not come in contact with oxygen and it does not oxidize. A very thin Zn layer is able to significantly improve the mechanical and electrical properties of the solder layer which is hundreds of time thicker. Laboratory tests showed that a Zn layer less than 0.5µ thick can positively influence a 50–100µ thick solder layer; in the preferred embodiment herein described the Zn layer thickness is less than 0.1µ.

This effect seems to be mainly due to the ternary alloy CuZnSn which is formed near the surface of the Cu substrate. Studying the thermodynamic behaviour, it is possible to see that the Sn and Zn attractive interaction for Cu atoms is in some way increased by their mutual repulsion, influencing the valence band, through possible orbital hybridization, and increasing the ternary alloy stability. The increase of the number of states at the Fermi energy level could account for a possible increase of the interface electrical properties.

Another important effect of the Zn pretreatment of the Cu substrate, according to the present invention is related to the aging behaviour of the coating. Artificial aging experiments have shown a good behaviour of the ternary alloy CuZnSn obtained with the method of the present invention due to the high deposit uniformity if compared with other Pb free solder methods.

DETAILED DESCRIPTION OF THE PREFERRED EMBODIMENT

According to a preferred embodiment the deposition of the Zn layer on the Cu substrate is performed with a process of electrodeposition. However other methods for depositing the Zn layer could be used, such as Chemical Vapour Deposition (CVD) or a sputtering process.

The Cu substrate is immersed in the bath, spaced apart from a suitable counterelectrode (anode). An electrical current is applied to the anode for cathodically reducing the salts in the bath (in this case Zn) to their respective metals and thereby deposit the desired solder alloy onto the board. The conductive substrate is kept immersed for a time sufficient to deposit a solder alloy coating of the desired thickness and composition upon the substrate. The substrate is subsequently withdrawn from the electroplating bath. The plated conductive substrate is thereafter washed thoroughly as quickly as possible, to minimize staining.

The electrodeposition can be done using either an acid or a basic electrolyte. An acid electrolyte can have the following composition:

| | |
|---|---|
| Zinc sulphate | 180 g/l |
| Zinc chloride | 14 g/l |
| Boric acid | 12 g/l |
| Salycilaldehyde | 1.5 g/l |
| Dextrin | 3 g/l |
| pH | 3 |
| temperature | room temp. |
| current density | 1 A/dm² |
| with deposition time between 10 s and 1 min | |

Alternatively, an alkaline Zn—Fe bath can be used as elctrolyte for the deposition of the Zn layer; it could have the following characteristics:

| | |
|---|---|
| Zinc | 10 g/l |
| Iron | 0.08 g/l |
| Caustic soda | 180 g/l |
| temperature | 35 C. |
| current density | 1 A/dm² |
| with deposition time between 30 s and 5 min | |

Afterwards the Sn—Bi solder alloy is deposited on the Zn layer. Again, according to a preferred embodiment of the present invention, the deposition is performed with an electrodeposition process, but other methods could be used.

The Sn—Bi alloy can be electrodeposited using as electrolyte a methane-sulphonate bath of composition and operating conditions as follows:

| | |
|---|---|
| Sn (as stannous methane sulphonate) | 8 g/l |
| Bi (as bismuth methane sulphonate) | 20 g/l |
| Methane sulphonic acid | 500 ml/l |
| Finish treatment additive | 60 ml/l |
| pH | 0.3 |
| Temperature | 20–40 C. |
| current density | 0.5–1 A/dm² |

With a deposition time of 50 min a layer in the range of 50–100 micron can be obtained, with a uniform and near eutectic composition containing about 42% of Sn and 58% of Bi. A eutectic alloy is characterized by a eutectic point, where the liquid and solid lines of all the components meet; a concentration change in either direction from the eutectic results in an increase in the liquid temperature.

The solder alloys according to the preferred embodiment of the present invention have a melting temperature that is then enough low to avoid damaging the components of the PCB or impairing the conductivity characteristics of the board.

According to the preferred embodiment described above, the deposition of the Zn layer and of the solder alloy has been made on the Cu substrate. It is of course equivalent the deposition of the Zn layer and of the solder alloy on the component to be joined with the substrate if the contacts of the electronic component present a Cu surface.

The method of the present invention is particularly useful in microelectronic applications, typically in the manufacturing of electronic modules, for assembly of components onto the boards. However it could be used in any case where an electronic component has to be joined with a Cu substrate. This method is compatible with current soldering methods and materials, and can be utilized as a replacement for the most popular lead-containing solders for electronic assembly, without changes to reflow temperatures, process chemicals or equipment.

We claim:

1. A method for soldering an electronic component onto a copper (Cu) substrate using a tin (Sn) solder alloy, said method comprising the steps of:

providing a Cu substrate:

electrodepositing on the Cu substrate a thin zinc (Zn) layer;

electrodepositing lead (Pb) free Sn solder alloy over the Zn layer;

positioning an electronic component on said Sn solder alloy; and reflowing the Sn solder alloy to physically and electrically connect the electronic component to the Cu substrate.

2. The method of claim 1 wherein the Pb free Sn solder alloy is a tin-bismuth (Sn—Bi) alloy electrodeposited for a desposition time using a bath composition comprising stannous methane sulphonate, bismuth methane sulphonate and methane sulfonic acid.

3. The method of claim 2 wherein the bath composition comprises the following quantities:

| | |
|---|---|
| stannous methane sulphonate | 8 grams/liter; |
| bismuth methane sulphonate | 20 grams/liter; |
| methane sulfonic acid | 500 milliliters/liter; | and an operating temperature of about 20 degrees Celsius (C.) to about 40 degrees C.

4. The method of claim 3 wherein the deposition time using the bath composition is about 50 minutes.

5. The method of claim 2 wherein the Sn—Bi solder alloy formed from the bath composition comprises about 42 percent Sn and about 58 percent Bi.

6. The method of claim 1 wherein the electrodeposition of the Zn layer is performed using an alkaline Zn—Fe or acid electrodeposition bath.

7. The method of claim 1 wherein the thin Zn layer is electrodeposited to a thickness less than 0.1μ.

8. The method of claim 7 wherein the thickness of the Sn solder alloy is deposited to a thickness at least 100 times the thickness of the thin Zn layer.

9. The method of claim 8 wherein the Sn solder alloy is deposited to a thickness of from 100 to 200 times the thickness of the thin Zn layer.

10. The method of claim 1 wherein the thin Zn layer is electrodeposited for a desposition time from a bath having a bath composition temperature and the following composition:

| | |
|---|---|
| zinc sulphate | 180 grams/liter; |
| zinc chloride | 14 grams/liter; |
| boric acid | 12 grams/liter; |
| salycilaldehyde | 1.5 grams/liter; and |
| dextrin | 3 grams/liter. |

11. The method of claim 10 wherein the bath composition temperature is room temperature and the deposition time is from about 10 seconds to about one minute.

12. The method of claim 1 wherein the thin Zn layer is electrodeposited for a desposition time from a bath having a bath composition temperature and the following composition:

| | |
|---|---|
| zinc | 10 grams/liter; |
| iron | 0.08 grams/liter; and |
| caustic soda | 180 grams/liter. |

13. The method of claim 12 wherein the bath composition temperature is about 35 degrees C. and the deposition time is from about 30 seconds to five minutes.

* * * * *